(12) United States Patent
Vincent et al.

(10) Patent No.: US 11,823,968 B2
(45) Date of Patent: Nov. 21, 2023

(54) SEMICONDUCTOR DEVICE PACKAGE HAVING STRESS ISOLATION AND METHOD THEREFOR

(71) Applicant: NXP USA, INC., Austin, TX (US)

(72) Inventors: Michael B. Vincent, Chandler, AZ (US); Scott M. Hayes, Chandler, AZ (US); Stephen Ryan Hooper, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/005,003

(22) Filed: Aug. 27, 2020

(65) Prior Publication Data

US 2022/0068738 A1    Mar. 3, 2022

(51) Int. Cl.
*H01L 23/31* (2006.01)
*H01L 21/56* (2006.01)
*H01L 21/52* (2006.01)
*H01L 23/02* (2006.01)

(52) U.S. Cl.
CPC .............. *H01L 23/31* (2013.01); *H01L 21/52* (2013.01); *H01L 21/56* (2013.01); *H01L 23/02* (2013.01)

(58) Field of Classification Search
CPC ......... H01L 23/31; H01L 23/02; H01L 21/52; H01L 21/56
USPC .......................................................... 257/678
See application file for complete search history.

(56) References Cited

U.S. PATENT DOCUMENTS

| | | | |
|---|---|---|---|
| 7,351,609 B2 | 4/2008 | Wu et al. | |
| 9,146,170 B2 | 9/2015 | Wen et al. | |
| 9,598,280 B2 | 3/2017 | Singh et al. | |
| 9,790,089 B2 | 10/2017 | Dawson et al. | |
| 9,818,712 B2 | 11/2017 | Holm et al. | |
| 10,041,847 B2 | 8/2018 | Han et al. | |
| 10,717,645 B2 * | 7/2020 | Feyh | H01L 23/28 |
| 2003/0186482 A1 | 10/2003 | Schuurmans et al. | |
| 2017/0364726 A1 * | 12/2017 | Buchan | H01L 41/047 |
| 2019/0057992 A1 * | 2/2019 | Chen | H01L 27/14636 |
| 2021/0366800 A1 * | 11/2021 | Lee | H01L 21/78 |

* cited by examiner

*Primary Examiner* — Quoc D Hoang

(57) ABSTRACT

A semiconductor device package having stress isolation is provided. The semiconductor device package includes a package substrate and a sensor attached to the package substrate. A first isolation material is formed around a perimeter of the sensor. An encapsulant encapsulates at least a portion of the first isolation material and the package substrate.

20 Claims, 22 Drawing Sheets

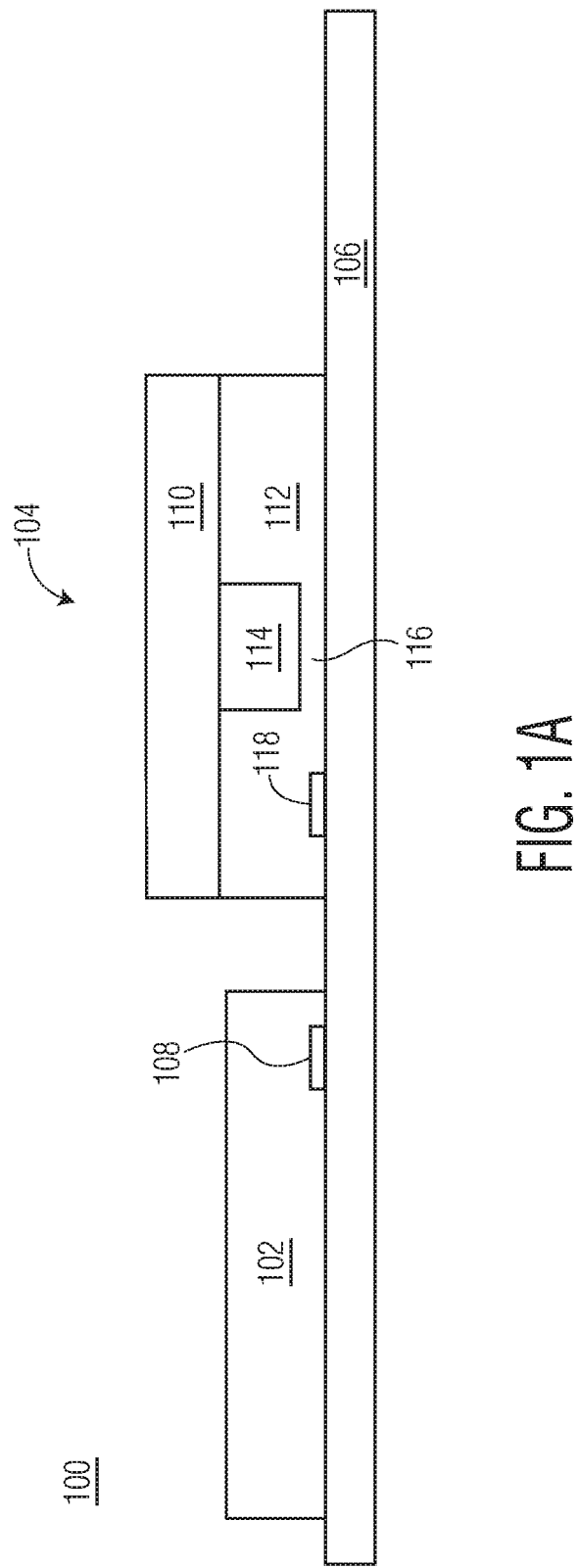

SEMICONDUCTOR DEVICE PACKAGE HAVING STRESS ISOLATION AND METHOD THEREFOR

BACKGROUND

Field

This disclosure relates generally to semiconductor device packaging, and more specifically, to a semiconductor device package having stress isolation and method of forming the same.

Related Art

Today, there is an increasing trend to include sophisticated semiconductor devices in products and systems that are used every day. These sophisticated semiconductor devices often have sensitive circuitry and features that can be adversely affected by environmental conditions. However, significant challenges exist to minimize or eliminate the effects of environmental conditions on such sensitive circuitry and features.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package having stress isolation. After a semiconductor device (e.g., sensor die) is placed on a substrate, a low modulus isolation material is formed around a perimeter of the semiconductor device. An isolation cavity is formed in an encapsulant encapsulating the sensor. A bottom of the cavity exposes a portion of the isolation material around the perimeter. A second low modulus material is formed in the cavity such that the sensor is isolated from potential stress induced by the encapsulant.

FIG. 1A through FIG. 6B illustrate, in simplified cross-sectional views and corresponding plan views, an example semiconductor device package 100 at stages of manufacture in accordance with an embodiment.

Figure 1B:
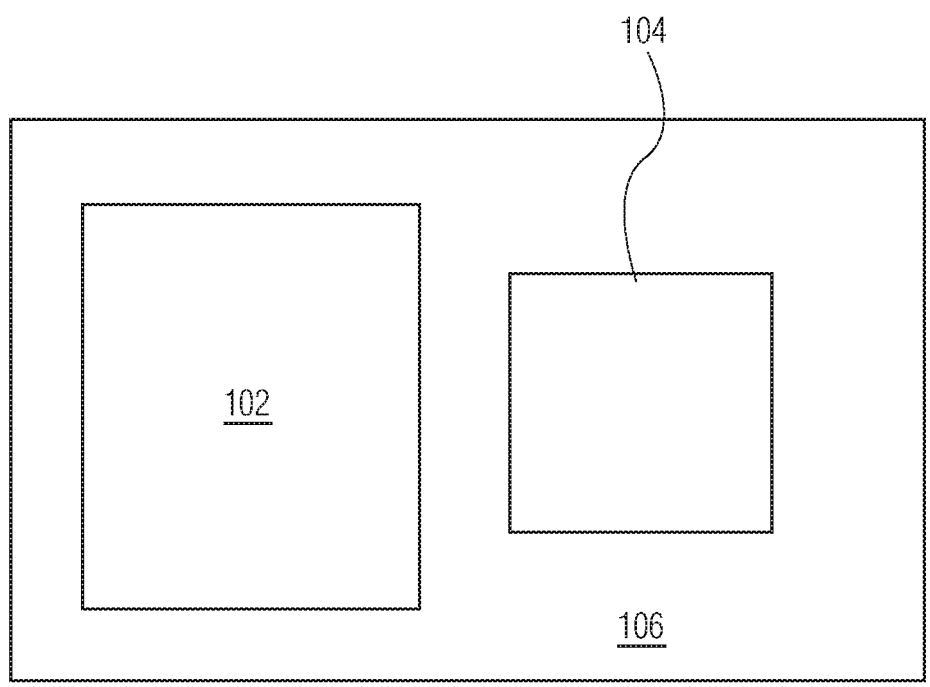
FIG. 1A through FIG. 6B illustrate, in simplified cross-sectional views and corresponding plan views, an example semiconductor device package at stages of manufacture in accordance with an embodiment.

FIG. 1A and FIG. 1B illustrate, in simplified cross-sectional view and corresponding plan view, the example semiconductor device package 100 at a stage of manufacture in accordance with an embodiment. At this stage of manufacture, the package 100 includes a semiconductor die 102 and a sensor die 104 placed on a carrier substrate 106. In this embodiment, the carrier substrate 106 serves as a substrate which is removed at a subsequent stage of manufacture.

The semiconductor die 102 has an active surface (e.g., major surface having circuitry) and a backside surface (e.g., major surface opposite of the active surface). The semiconductor die 102 includes bond pads 108 at the active surface configured for connection to the sensor die 104 by way of a package substrate, for example. The semiconductor die 102 may be formed from any suitable semiconductor material, such as silicon, germanium, gallium arsenide, gallium nitride and the like. Semiconductor die 102 may further include any digital circuits, analog circuits, RF circuits, memory, processor, the like, and combinations thereof.

The sensor die 104 has an active surface (e.g., major surface having circuitry and sensor structures) and a backside surface (e.g., major surface opposite of the active surface). The sensor die 104 includes bond pads 118 at the active surface configured for connection to the semiconductor die 102 by way of the package substrate, for example. In this embodiment, the sensor die 104 is characterized as a pressure sensor formed having a base die portion 112 including a cavity 114 and a transducer diaphragm structure 116. A cover die portion 110 forms an airtight seal with the cavity 114 such that the sealed cavity 114 has a known volume and pressure. The sensor die 104 may further include other circuitry and sensor structures.

Figure 2A:
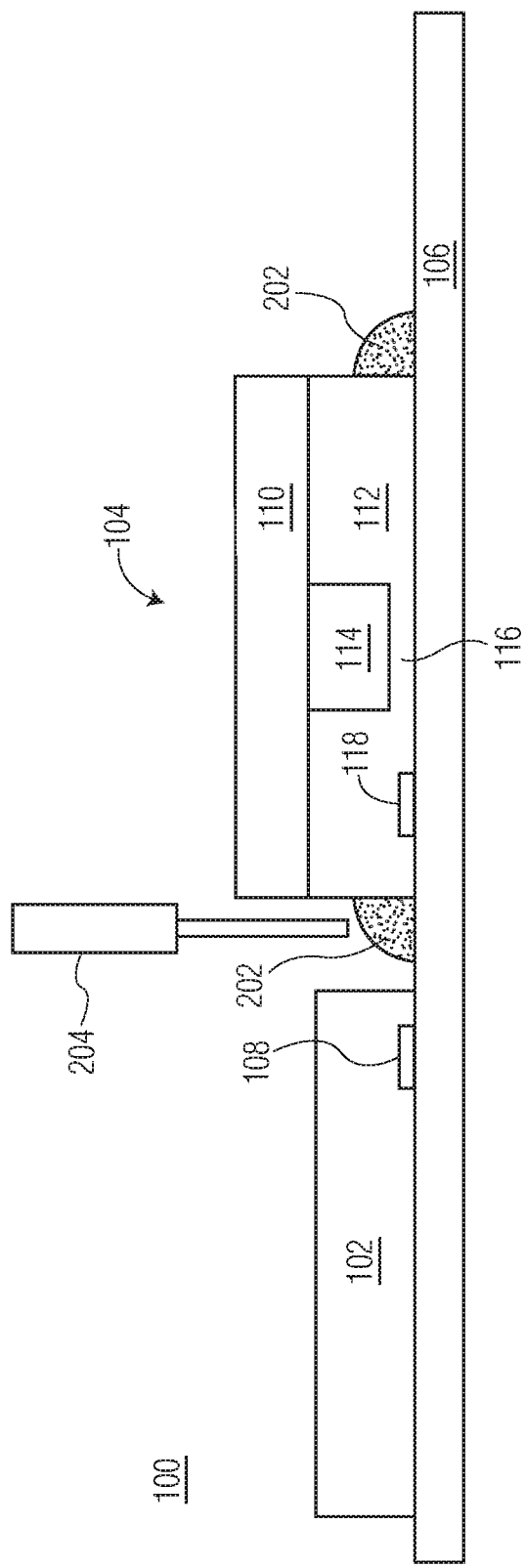
Figure 2B:
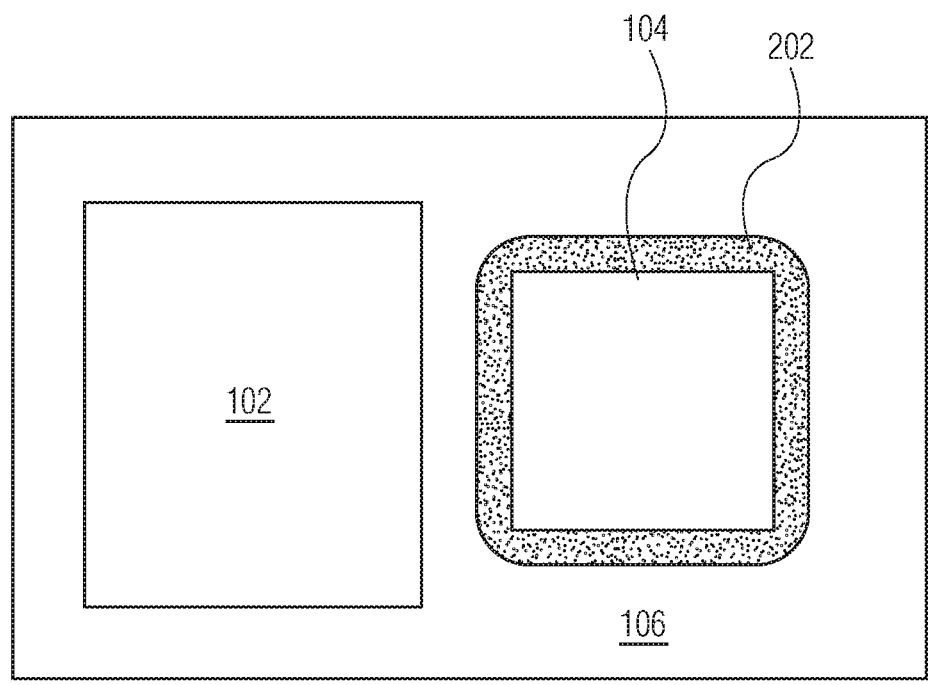

FIG. 2A and FIG. 2B illustrate, in simplified cross-sectional view and corresponding plan view, the example semiconductor device package 100 at a subsequent stage of manufacture in accordance with an embodiment. At this stage of manufacture, a low modulus isolation material 202 is formed around a perimeter of the sensor die 104. In this embodiment, a dispenser 204 dispenses a low modulus isolation material 202, such as a silicon adhesive material, around the perimeter of the sensor die 104. The isolation material 202 may be dispensed or deposited using any suitable methods or techniques such as by way of pin-needle, jet, aerosol, and the like. The term low modulus, as used herein, refers to materials having a modulus (e.g., stiffness) value in a range of 100 MPa and lower. The isolation material 202 is formed having contact with at least a portion of the sidewalls of the sensor die 104 and a portion of the carrier substrate 106. In an embodiment depicted in FIG. 8A and FIG. 8B, the isolation material 202 may be formed substantially covering the sidewalls of the sensor die 104 in addition to a portion of the carrier substrate 106 such that a portion of the isolation material 202 is exposed at a top surface after a molding process, for example.

Figure 3A:
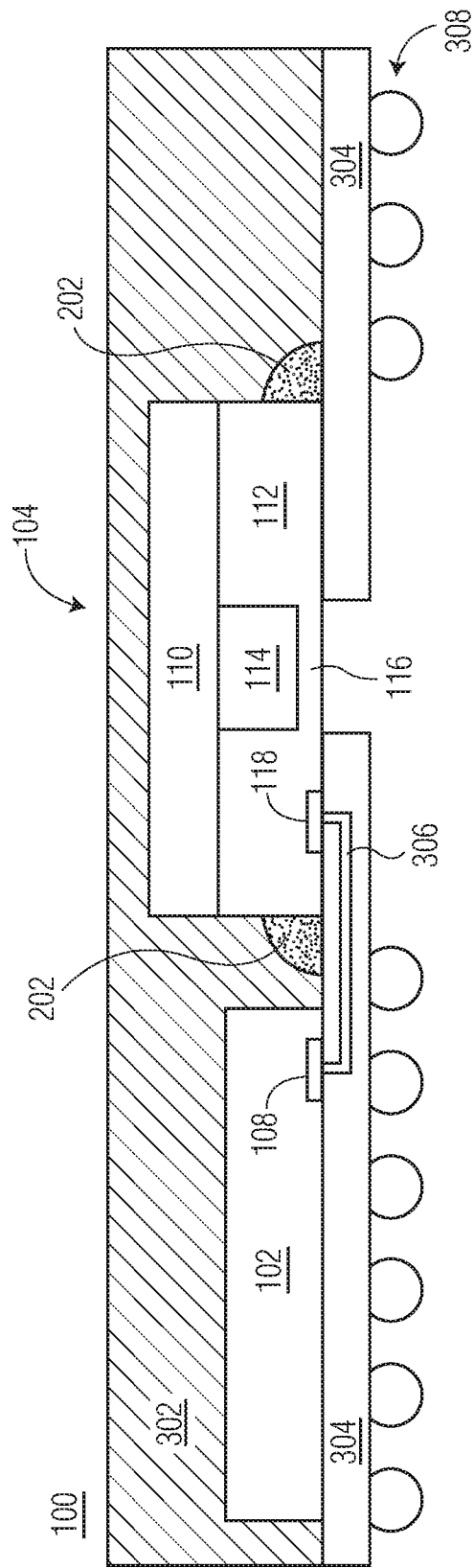
Figure 3B:
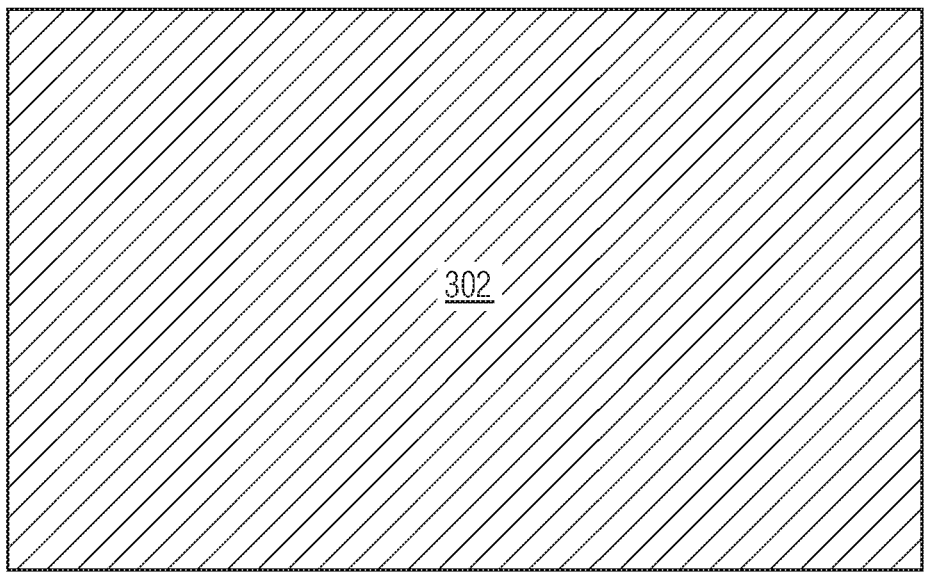

FIG. 3A and FIG. 3B illustrate, in simplified cross-sectional view and corresponding plan view, the example semiconductor device package 100 at a subsequent stage of manufacture in accordance with an embodiment. At this stage of manufacture, the package 100 includes an encapsulant (e.g., epoxy material) 302 at least partially encapsulating semiconductor die 102, sensor die 104, and isolation material 202, along with a package substrate 304 and ball connectors 308. In this embodiment, the semiconductor die 102, sensor die 104, isolation material 202, and exposed portions of the carrier substrate 106 are over-molded with an epoxy material encapsulant before the carrier substrate 106 is removed. After the carrier substrate 106 is removed, the package substrate 304 is applied to the resulting exposed bottom surface including active surfaces of the semiconductor die 102 and sensor die 104, isolation material 202, and encapsulant 302. Conductive feeds 306 are formed in the package substrate 304 between bond pads 108 and 110 to interconnect semiconductor die 102 and sensor die 104 respectively.

After the package substrate 304 is applied, conductive ball connectors 308 (e.g., solder balls) are affixed to a bottom surface of the package substrate 304. The ball connectors 308 are configured and arranged to provide conductive connections with a printed circuit board (PCB), for example. Ball connectors 308 may be any suitable conductive structure such as solder ball, gold studs, copper pillars, and the like, to connect conductive features of the package 100 with the PCB. In this embodiment, the package substrate 304 is formed as a build-up substrate including a redistribution layer. In some embodiments, the package substrate 304 may be formed as a pre-formed substrate including a redistribution layer.

Figure 4A:
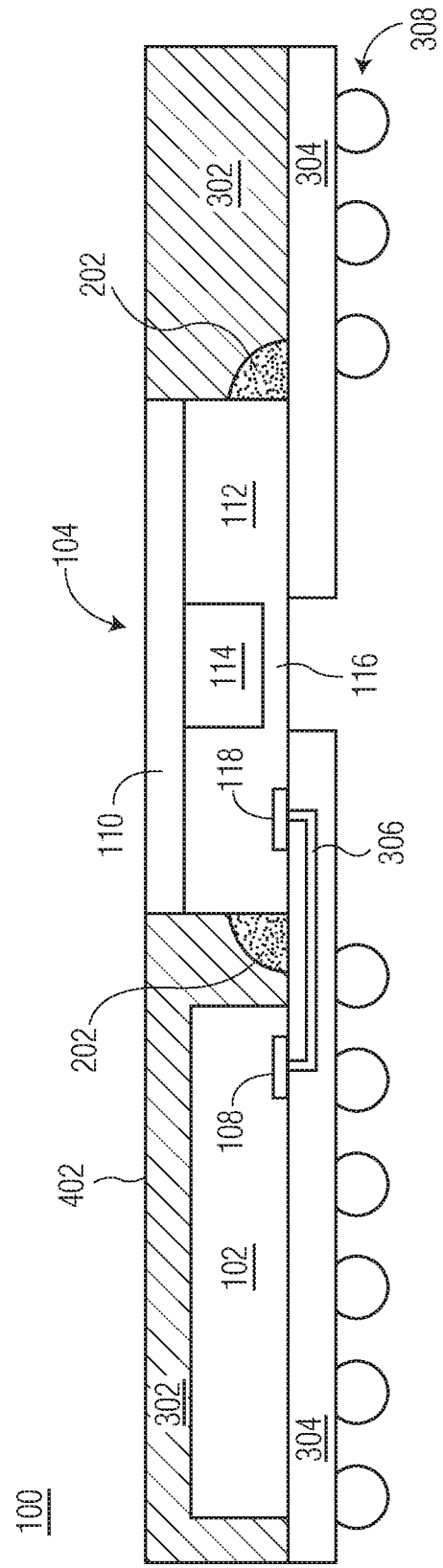
Figure 4B:
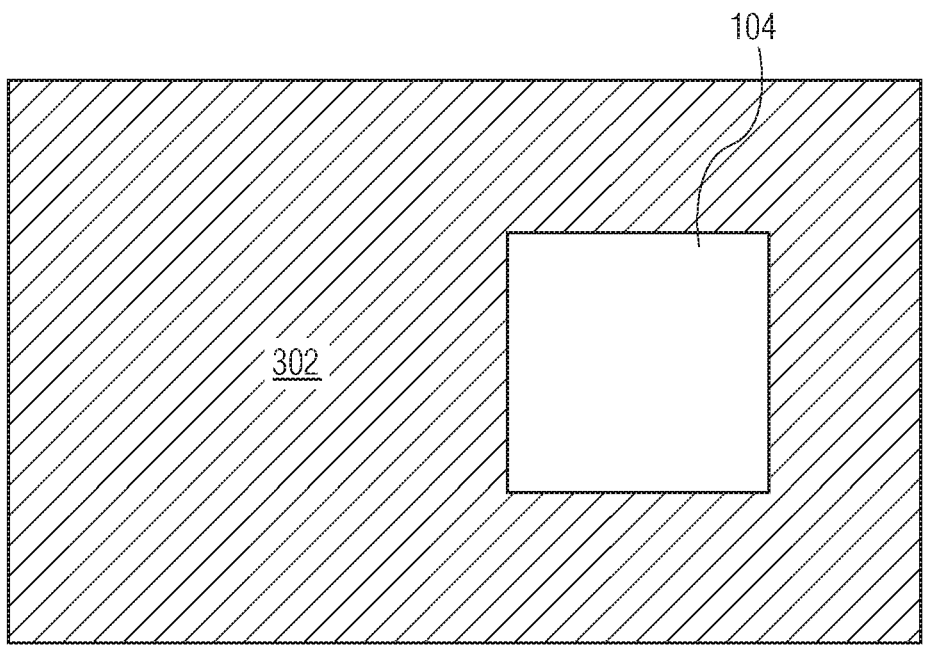

FIG. 4A and FIG. 4B illustrate, in simplified cross-sectional view and corresponding plan view, the example semiconductor device package 100 at a subsequent stage of manufacture in accordance with an embodiment. At this stage of manufacture, the package 100 includes an exposed backside surface of the sensor die 104. In this embodiment, a back-grind operation is performed on a top surface 402 of the encapsulant 302 of package 100 to expose the backside surface of sensor die 104. After the back-grind operation, the backside surface of the sensor is substantially coplanar with top surface 402 of the encapsulant 302. In other embodiments, the backside surface of the sensor die 104 may be exposed and coplanar with a top surface of the encapsulant 302 by way of a film assisted molding (FAM) process as depicted in FIG. 7A, 7B and FIG. 8A, 8B, for example.

Figure 5A:
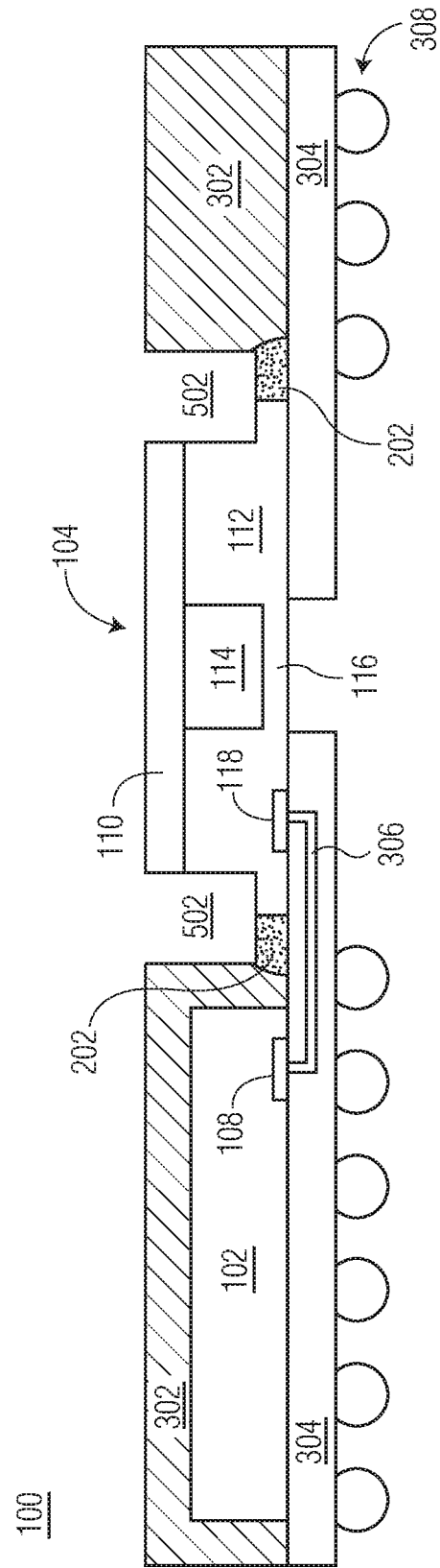
Figure 5B:
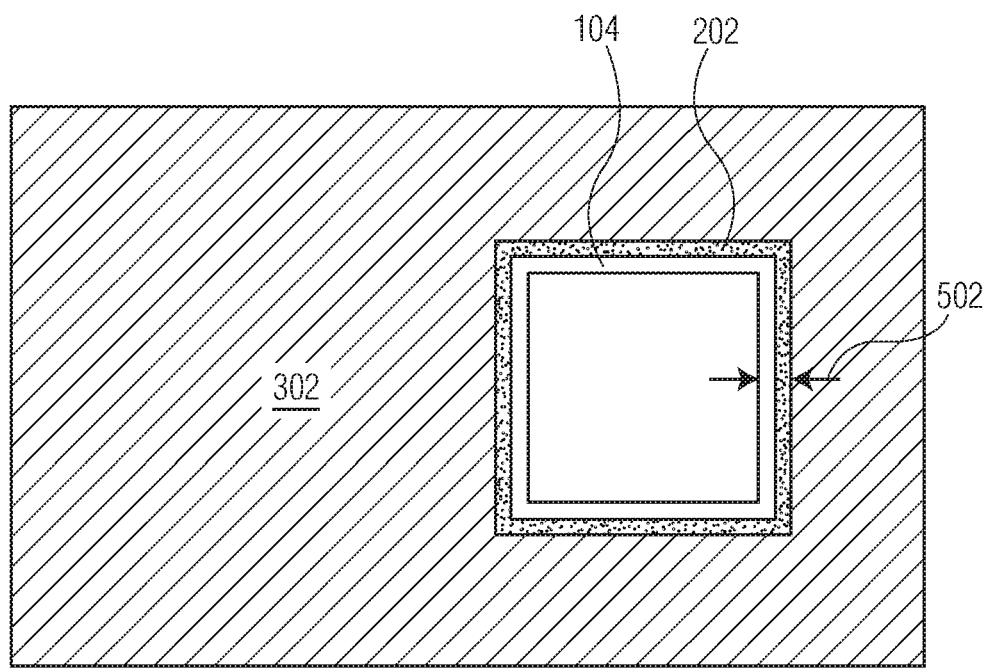

FIG. 5A and FIG. 5B illustrate, in simplified cross-sectional view and corresponding plan view, the example semiconductor device package 100 at a subsequent stage of manufacture in accordance with an embodiment. At this stage of manufacture, the package 100 includes an isolation cavity 502 formed around a perimeter of the sensor die 104 exposing a portion of the isolation material 202. In this embodiment, the isolation cavity 502 is formed adjacent to the outer sidewalls of the sensor die 104 such that a bottom surface or portion of the isolation cavity 502 exposes a portion of the isolation material 202. Accordingly, a minor portion of the outer sidewalls may be removed as the isolation cavity 502 is formed. In some embodiments, to protect the integrity of the outer sidewalls of the sensor die 104, a portion of the encapsulant may remain between the isolation cavity 502 and the sidewalls of the sensor die 104. With the formed isolation cavity, the senser die 104 is isolated from potential stress induced by the encapsulant 302. The isolation cavity 502 may be formed by suitable methods and techniques including laser ablation, sawing, or mechanical routing, for example.

Figure 6A:
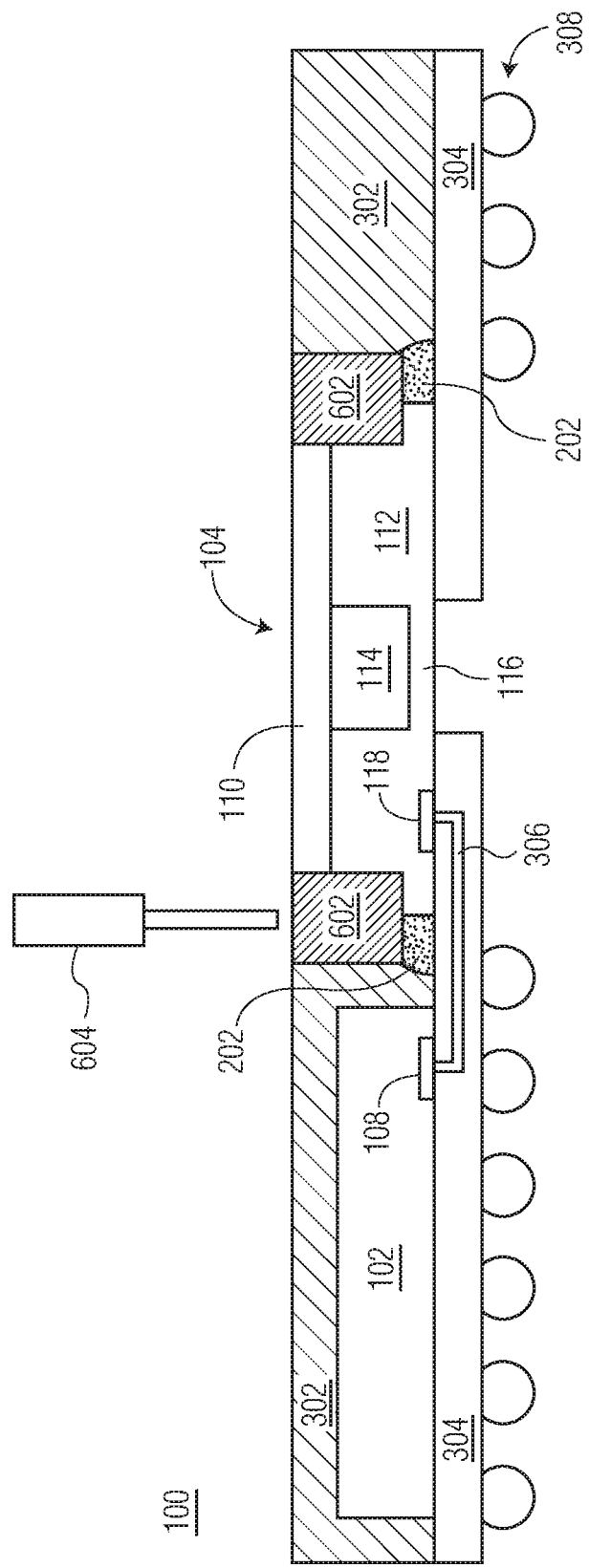
Figure 6B:
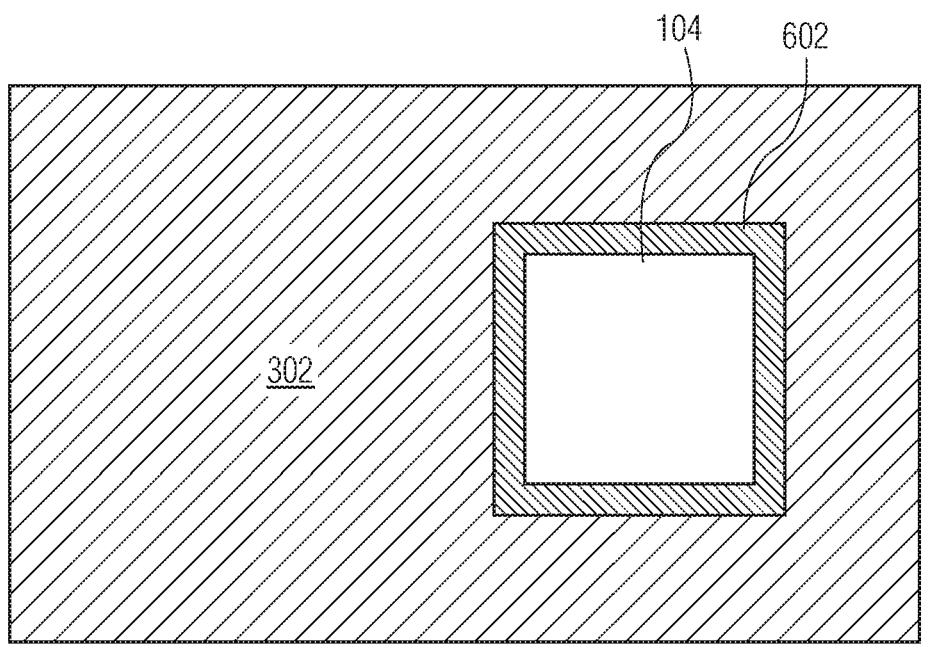

FIG. 6A and FIG. 6B illustrate, in simplified cross-sectional view and corresponding plan view, the example semiconductor device package 100 at a subsequent stage of manufacture in accordance with an embodiment. At this stage of manufacture, the package 100 includes a second low modulus isolation material 602 deposited in the isolation cavity (502) formed around the perimeter of the sensor die 104. In this embodiment, a dispenser 604 dispenses the low modulus isolation material 602, such as a silicone adhesive or gel material, substantially filling the isolation cavity (502) around the perimeter of the sensor die 104. The isolation material 602 may be dispensed or deposited using suitable methods and techniques. In this embodiment, the isolation material 602 is charactered as a low modulus material having a modulus (e.g., stiffness) value in a range of 100 MPa and lower. By substantially filling the isolation cavity (502) with the isolation material 602, the senser die 104 remains isolated from potential stress induced by the encapsulant 302 while the isolation material 602 serves to protect the senser die 104 from contaminants, for example.

Figure 7A:
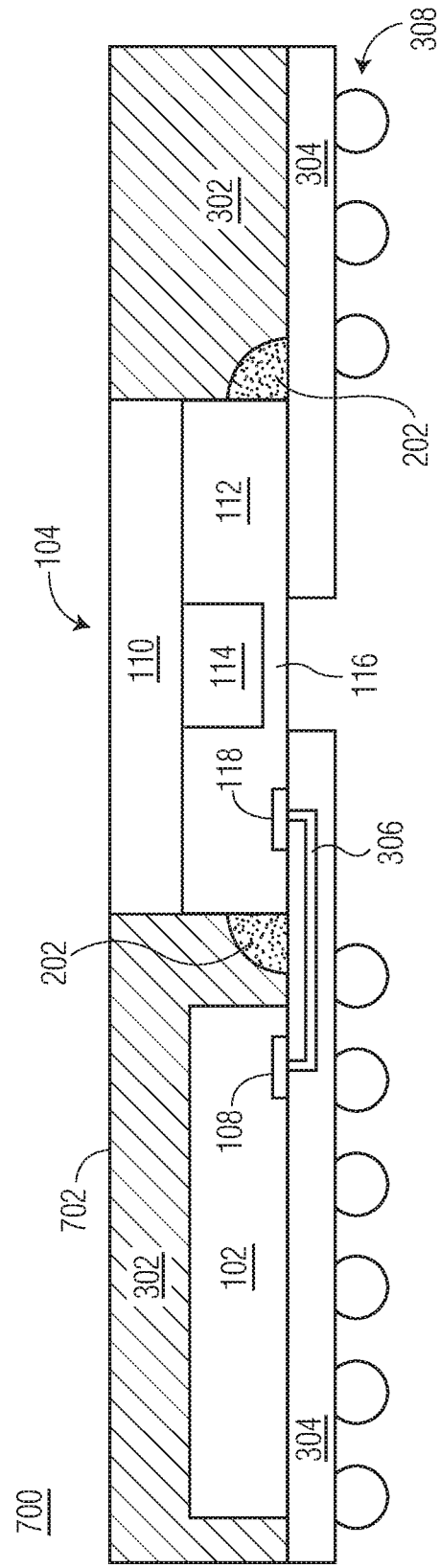
FIG. 7A and FIG. 7B illustrate, in simplified cross-sectional view and corresponding plan view, an example semiconductor device package at an alternative stage of manufacture in accordance with an embodiment.
Figure 7B:
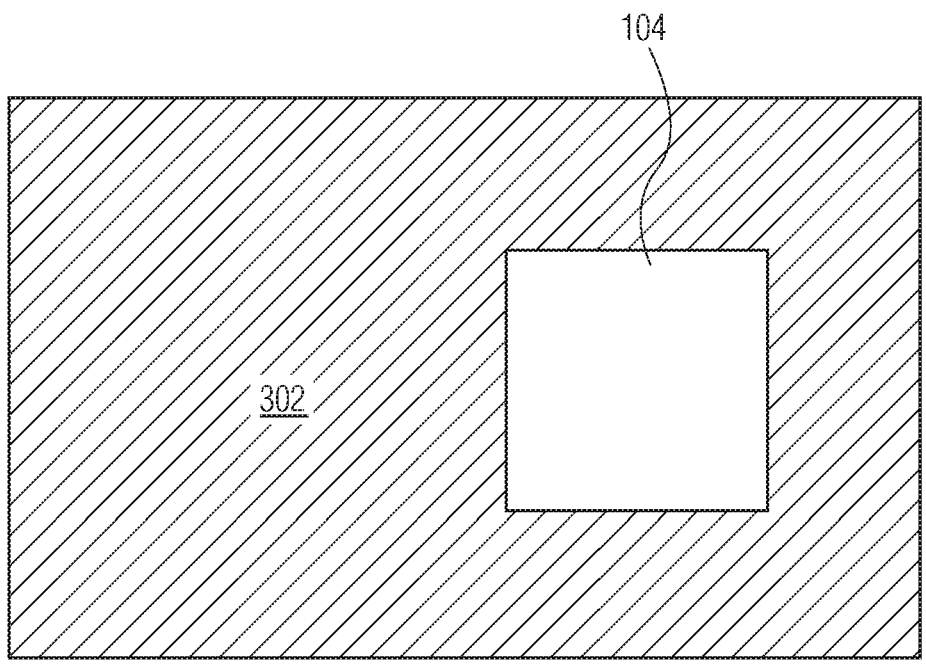

FIG. 7A and FIG. 7B illustrate, in simplified cross-sectional view and corresponding plan view, an example semiconductor device package 700 at a stage of manufacture in accordance with an embodiment. At this stage, the package 700 includes the backside surface of the sensor die 104 exposed and coplanar with a top surface 702 of the encapsulant 302 by way of a FAM process. In this alternative embodiment, the semiconductor die 102, sensor die 104, isolation material 202, and exposed portions of the carrier substrate 106 are over-molded with an epoxy material encapsulant using a FAM process. The backside surface of the sensor die 104 is exposed and coplanar with a top surface 702 of the encapsulant 302. After the FAM process, the carrier substrate 106 is removed and the package substrate 304 is applied to the resulting exposed bottom surface including active surfaces of the semiconductor die 102 and sensor die 104, isolation material 202, and encapsulant 302. Conductive feeds 306 formed in the package substrate 304 provide an interconnect between the semiconductor die 102 and the sensor die 104. After the package substrate 304 is applied, conductive ball connectors 308 (e.g., solder balls) are affixed to a bottom surface of the package substrate 304. The embodiment depicted in FIG. 7A and FIG. 7B may be considered as an alternative to the over molding and back-grinding stages of manufacture depicted in FIG. 3A, 3B and FIG. 4A, 4B of the example semiconductor device package 100.

Figure 8A:
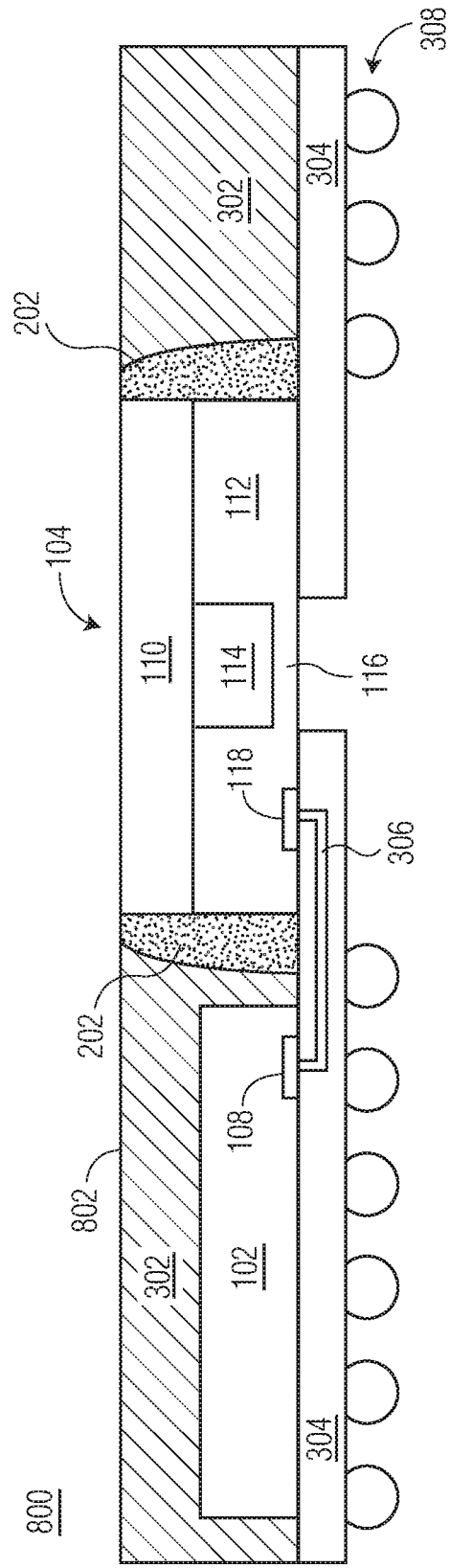
FIG. 8A and FIG. 8B illustrate, in simplified cross-sectional view and corresponding plan view, an example semiconductor device package at an alternative stage of manufacture in accordance with an embodiment.
Figure 8B:
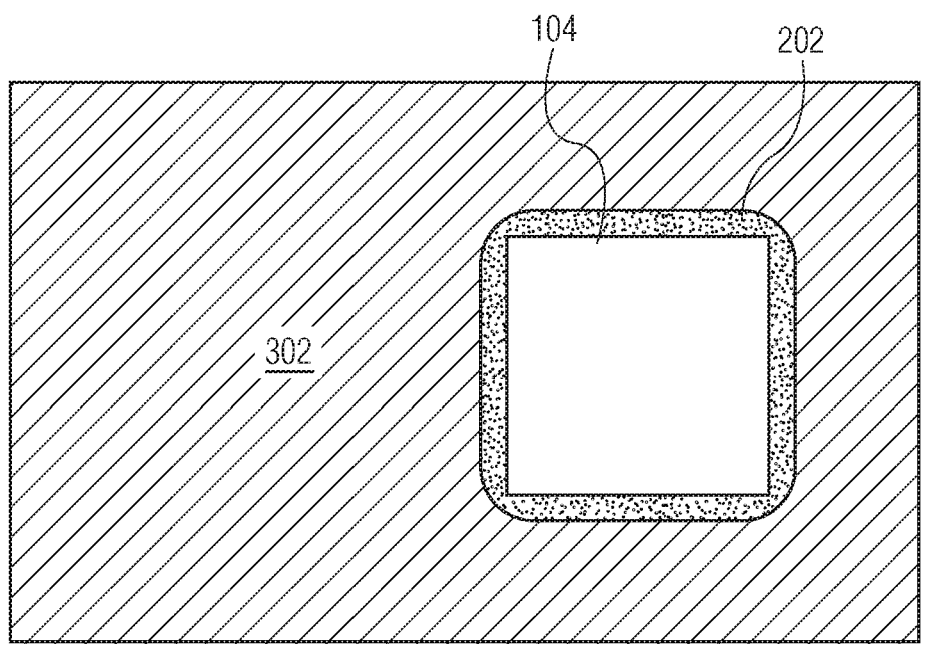

FIG. 8A and FIG. 8B illustrate, in simplified cross-sectional view and corresponding plan view, an example semiconductor device package 800 at a stage of manufacture in accordance with an embodiment. At this stage, the package 800 includes an encapsulant (e.g., epoxy material) 302 at least partially encapsulating semiconductor die 102 and low modulus isolation material 202, along with a package substrate 304 and ball connectors 308. In this alternative embodiment, the isolation material 202 is formed substantially covering the outer sidewalls of the sensor die 104 and exposed at a top surface by way of a FAM process. The backside surface of the sensor die 104 is exposed and coplanar with a top surface 802 of the encapsulant 302. After the FAM process, the carrier substrate 106 is removed and the package substrate 304 is applied to the resulting exposed bottom surface including active surfaces of the semiconductor die 102 and sensor die 104, isolation material 202, and encapsulant 302. Conductive feeds 306 formed in the package substrate 304 provide an interconnect between the semiconductor die 102 and the sensor die 104. After the package substrate 304 is applied, conductive ball connectors 308 (e.g., solder balls) are affixed to a bottom surface of the package substrate 304. In this embodiment, the low modulus isolation material 202 isolates the sensor die 104 from potential stress induced by the encapsulant 302. For example, the sensor die 104 is surrounded by the isolation material 202 such that the encapsulant 302 cannot directly contact the sensor die 104. Accordingly, the embodiment depicted in FIG. 8A, 8B may be considered as an alternative to the isolation cavity and filling stages of manufacture depicted in FIG. 5A, 5B and FIG. 6A, 6B of the example semiconductor device package 100.

FIG. 9A through FIG. 10B illustrate, in simplified cross-sectional views and corresponding plan views, an example semiconductor device package 900 including a differential pressure sensor 104 at stages of manufacture in accordance with an embodiment.

Figure 9A:
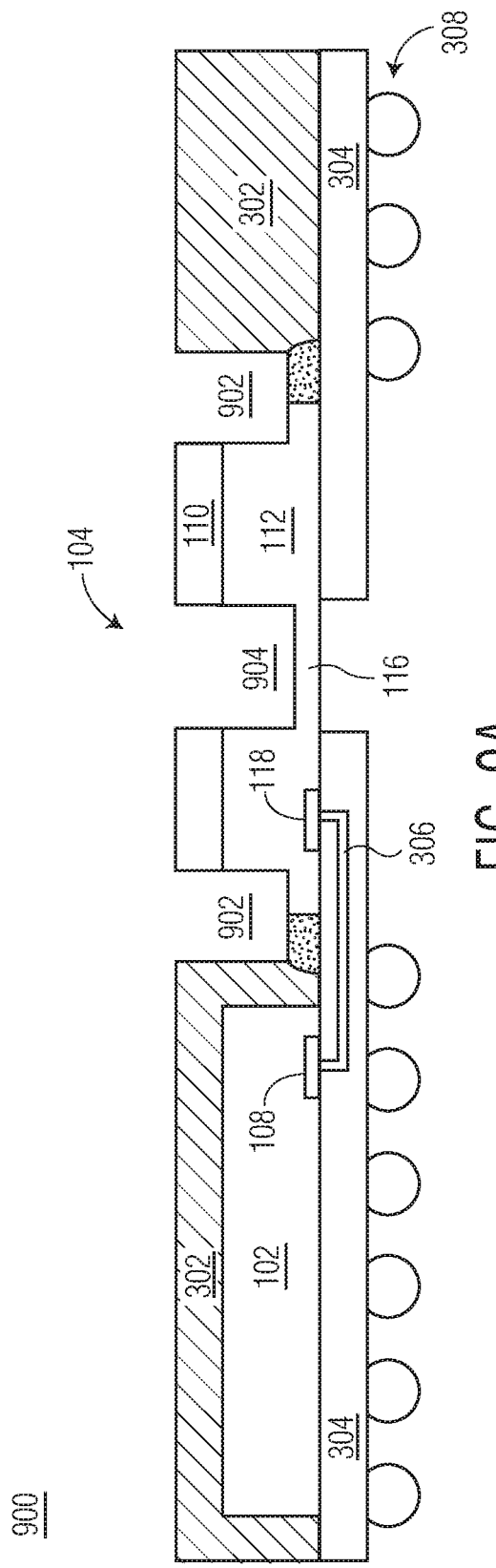
FIG. 9A through FIG. 10B illustrate, in simplified cross-sectional views and corresponding plan views, an example semiconductor device package including a differential pressure sensor at stages of manufacture in accordance with an embodiment.
Figure 9B:
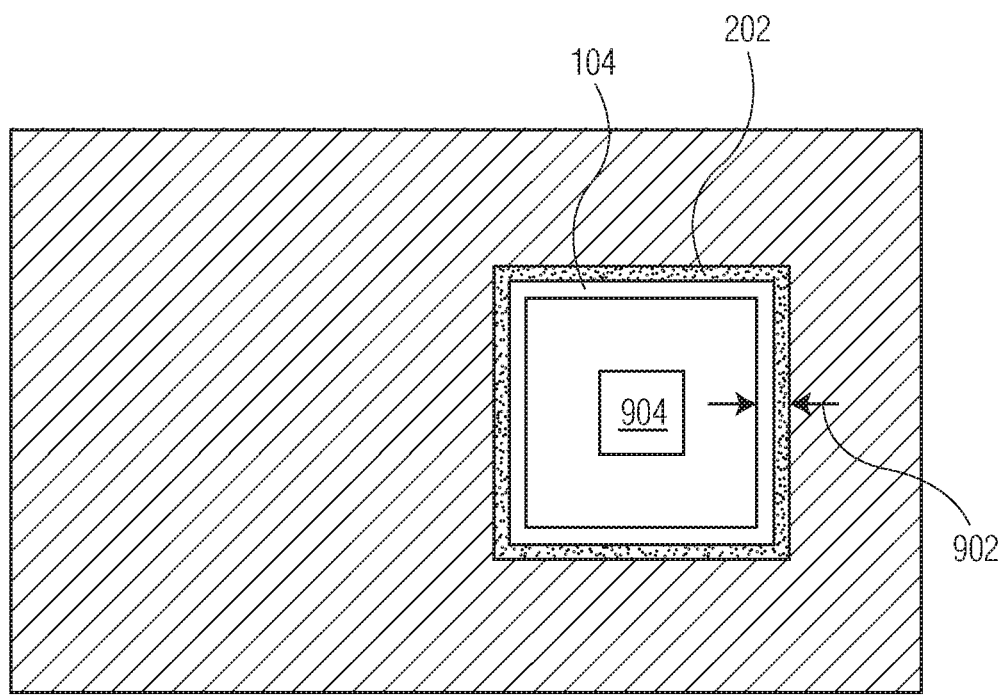

FIG. 9A and FIG. 9B illustrate, in simplified cross-sectional view and corresponding plan view, the example semiconductor device package 900 at a stage of manufacture in accordance with an embodiment. In this alternative embodiment, the sensor die 104 is characterized as a differential pressure sensor having an opening 904 exposing a backside portion of the transducer diaphragm structure 116. At this stage, the package 900 includes an isolation cavity 902 formed around a perimeter of the sensor die 104 exposing a portion of the isolation material 202. In this embodiment, the isolation cavity 502 is formed such that a bottom surface or portion of the isolation cavity 502 exposes a portion of the isolation material 202, thus, isolating the sensor die 104 from potential stress induced by the encapsulant 302.

Figure 10A:
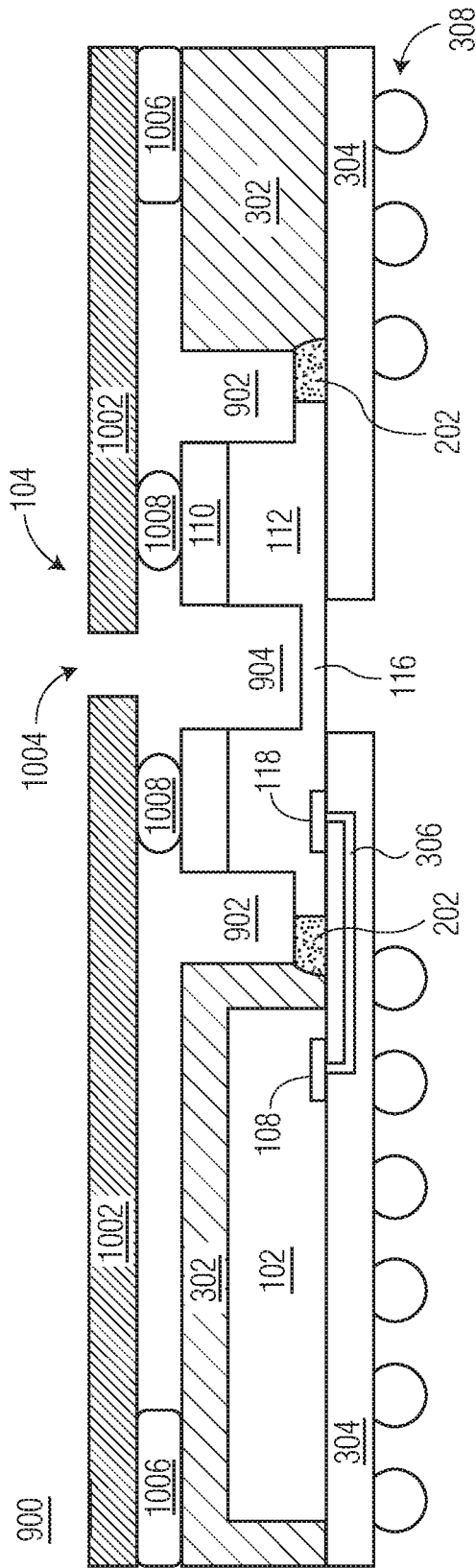
Figure 10B:
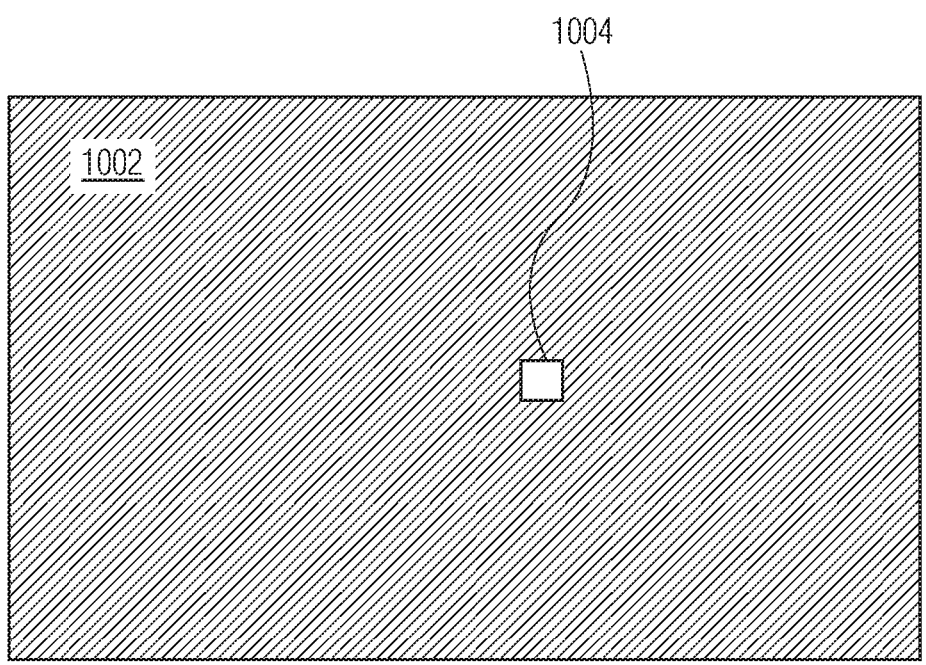

FIG. 10A and FIG. 10B illustrate, in simplified cross-sectional view and corresponding plan view, the example semiconductor device package 900 at a subsequent stage of manufacture in accordance with an embodiment. At this stage, the package 900 includes a lid 1002 attached over a top surface of the encapsulant 302 and backside surface of the sensor die 104. In this embodiment, the lid 1002 is attached to the top surface of the encapsulant 302 by way of an adhesive 1006 and serves to protect the sensor die 104, for example. The lid 1002 is configured with an opening 1004 sufficient for a differential pressure to be sensed by the sensor die 104. The lid 1002 may be formed from any suitable rigid material such as epoxy, ceramic, metal, silicon, and the like. In some embodiments, a low modulus material 1008 may be used to seal and isolate the cavity 904 from other portions of the package covered by the lid 1002. The low modulus material 1008 may provide additional mechanical support of the sensor die 104 while providing stress isolation.

Figure 11A:
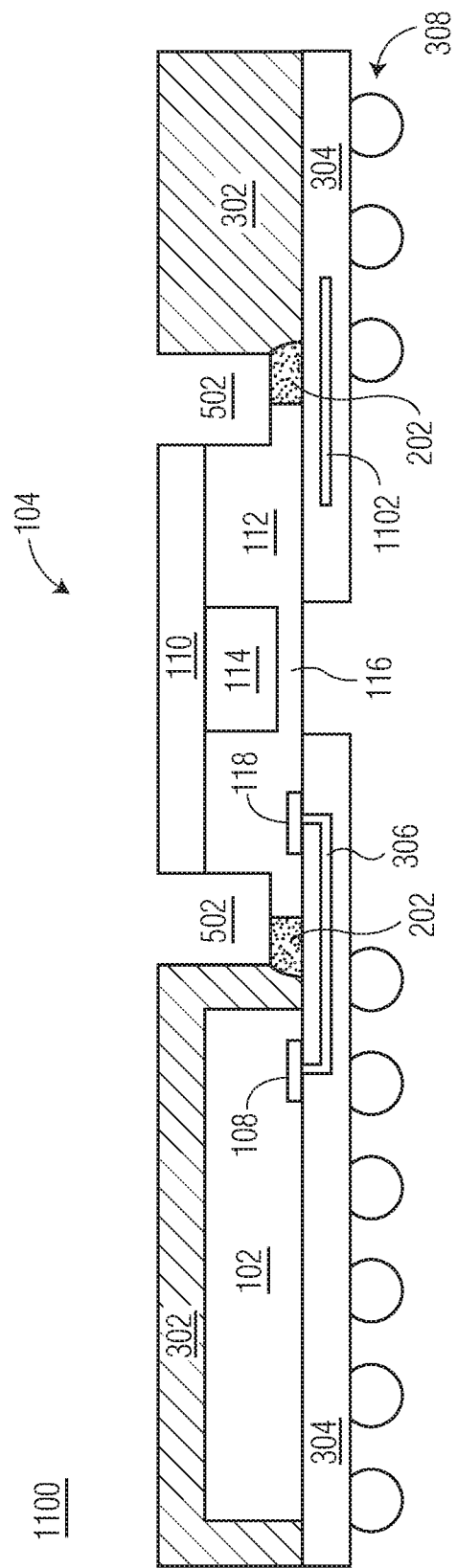
FIG. 11A through FIG. 11C illustrate, in simplified cross-sectional views and corresponding bottom views, an example semiconductor device package with reinforcement structures at stages of manufacture in accordance with an embodiment.
Figure 11B:
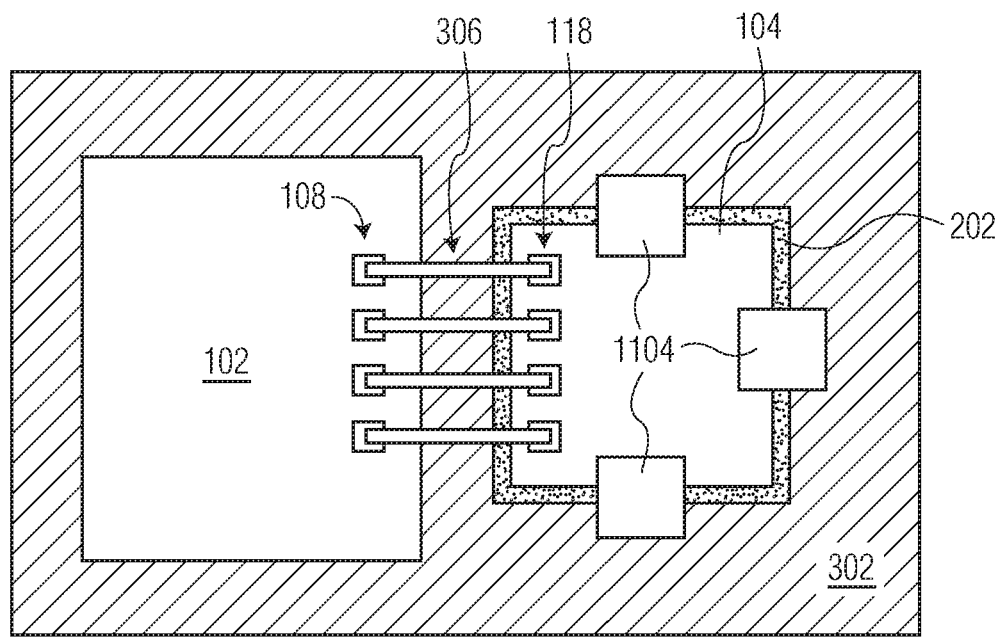
Figure 11C:
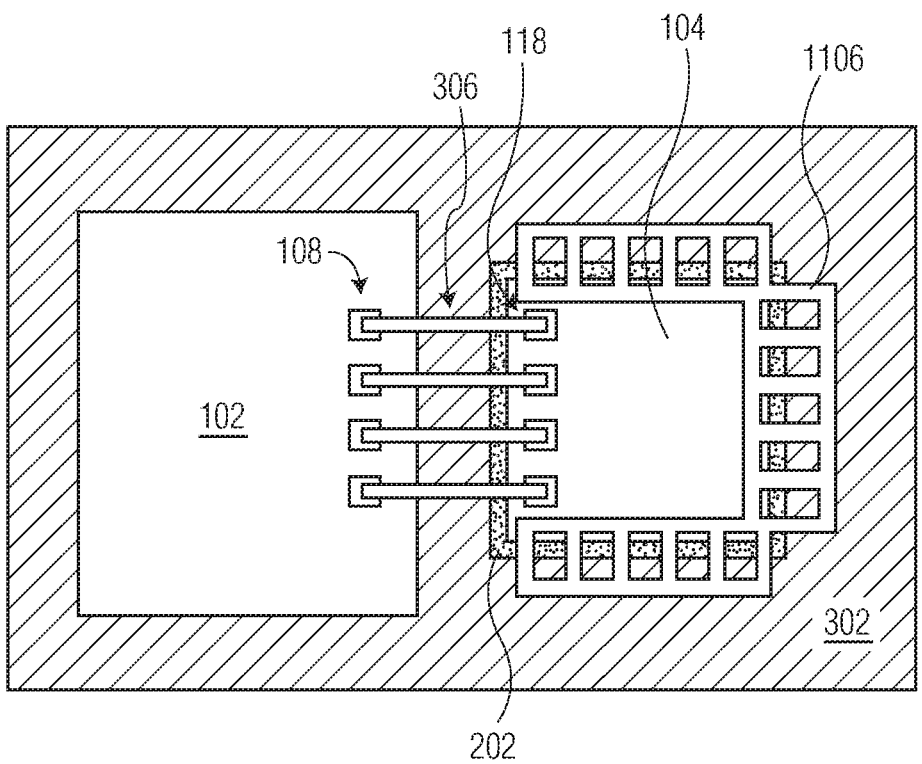

FIG. 11A through FIG. 11C illustrate, in simplified cross-sectional views and corresponding bottom views, an example semiconductor device package 1100 with reinforcement structures at stages of manufacture in accordance with an embodiment. At this stage, the package 1100 includes a reinforcement structure 1102 formed under portions of the isolation cavity 502. The embodiment depicted in FIG. 11A may be considered as an alternative to the embodiment depicted in FIG. 5A with the addition of the reinforcement structure 1102, for example. In this embodiment, the isolation cavity 502 remains empty and does not get filled with an isolation material (e.g., isolation material 602 of FIG. 6A, 6B) at a subsequent stage. Accordingly, the reinforcement structure 1102 formed under portions of the isolation cavity 502 provides additional support of the sensor die 104.

In the bottom view of package 1100 depicted in FIG. 11B, an example series of metal (e.g., copper) straps 1104 are formed as bridges between the sensor die 104 and the encapsulant 302. The metal straps 1104 correspond to the reinforcement structure 1102 formed under portions of the isolation cavity 502 depicted in FIG. 11A. In this embodiment, the bottom view includes metal features (e.g., conductive feeds 306 and straps 1104) of the package substrate 304, active surfaces of the semiconductor die 102 and sensor die 104, bottom surface of the isolation material 202 and encapsulant 302. Other features of the package substrate 304 and ball connectors 308 are not shown for illustration purposes. In this embodiment, the metal straps 1104 are configured and arranged to provide additional structural support of the sensor die 104. The bond pads 108 of the semiconductor die 102 are connected to the bond pads 118 of the sensor die 104 by way of the conductive feeds 306, for example.

In the bottom view of package 1100 depicted in FIG. 11C, an example metal (e.g., copper) mesh structure 1106 is formed as a mesh bridge between the sensor die 104 and the encapsulant 302. The metal mesh 1106 corresponds to the reinforcement structure 1102 formed under portions of the isolation cavity 502 depicted in FIG. 11A. In this embodiment, the bottom view includes metal features (e.g., conductive feeds 306 and mesh 1106) of the package substrate 304, active surfaces of the semiconductor die 102 and sensor die 104, bottom surface of the isolation material 202 and encapsulant 302. Other features of the package substrate 304 and ball connectors 308 are not shown for illustration purposes. The metal mesh 1106 is configured and arranged to provide additional structural support of the sensor die 104. The bond pads 108 of the semiconductor die 102 are connected to the bond pads 118 of the sensor die 104 by way of the conductive feeds 306, for example.

Generally, there is provided, a semiconductor device package including a package substrate; a sensor attached to the package substrate; a first isolation material formed around a perimeter of the sensor; and an encapsulant encapsulating at least a portion of the first isolation material and the package substrate. The semiconductor device package may further include an isolation cavity formed around the perimeter of the sensor, a bottom of the isolation cavity exposing a portion of the first isolation material. The semiconductor device package may further include a second isolation material disposed in the isolation cavity. The semiconductor device package may further include a semiconductor die attached to the package substrate, the encapsulant further encapsulating the semiconductor die. A conductive feed in the package substrate may be configured to provide a conductive path between the semiconductor die and the sensor. The sensor may be characterized as a pressure sensor. A backside surface of the sensor may be exposed and the backside surface of the sensor may be substantially coplanar with a top surface of the encapsulant. The encapsulant encapsulating at least a portion of the first isolation material and the package substrate may be formed by way of a film assisted mold process. The semiconductor device package may further include a lid attached over a top surface of the encapsulant.

In another embodiment, there is provided, a method of manufacturing a semiconductor device including placing a sensor on a carrier substrate, an active surface of the sensor contacting the carrier substrate; dispensing a first isolation material around a perimeter of the sensor; encapsulating with an encapsulant at least a portion of the first isolation material and the carrier substrate; and applying a package substrate on the active surface of the sensor and bottom surfaces of the first isolation material and the encapsulant, the package substrate including a redistribution layer. The method may further include forming an isolation cavity around the perimeter of the sensor, a bottom of the isolation cavity exposing a portion of the first isolation material. The method may further include back-grinding a top surface of the encapsulant to expose a top portion of the sensor before forming the isolation cavity. The method may further include dispensing a second isolation material into the isolation cavity around the perimeter of the sensor. The method may further include attaching a lid over a top surface of the encapsulant and the sensor. The method may further include placing a semiconductor die on the carrier substrate, and wherein a conductive feed in the package substrate is configured to provide a conductive path between the semiconductor die and the sensor. The encapsulating with an encapsulant may further include encapsulating by way of a film assisted molding process such that a top surface of the first isolation material is exposed.

In yet another embodiment, there is provided, a semiconductor device package including a package substrate; a sensor attached to the package substrate; a first isolation material formed around a perimeter of the sensor; an encapsulant encapsulating at least a portion of the sensor and the package substrate; and an isolation cavity formed around the perimeter of the sensor, a bottom of the isolation cavity exposing a portion of the first isolation material. The semiconductor device package may further include a second isolation material disposed in the isolation cavity. The semiconductor device package may further include a semiconductor die attached to the package substrate, the encapsulant further encapsulating the semiconductor die. A conductive feed in the package substrate may be configured to provide a conductive path between the semiconductor die and the sensor.

By now, it should be appreciated that there has been provided a semiconductor device package having stress isolation. After a semiconductor device (e.g., sensor die) is placed on a substrate, a low modulus isolation material is formed around a perimeter of the semiconductor device. An isolation cavity is formed in an encapsulant encapsulating the sensor. A bottom of the cavity exposes a portion of the isolation material around the perimeter. A second low modulus material is formed in the cavity such that the sensor is isolated from potential stress induced by the encapsulant.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a package substrate;
   a sensor die with an active surface and a backside surface opposite to the active surface, the active surface attached to the package substrate;
   a first low modulus isolation material formed around a perimeter of the sensor die; and
   an encapsulant encapsulating at least a portion of the first low modulus isolation material and the package substrate, wherein the first low modulus isolation material at least laterally isolates the sensor die from the encapsulant, wherein the backside surface of the sensor die is substantially coplanar with a top surface of the encapsulant.

2. The semiconductor device package of claim 1, further comprising an isolation cavity formed around the perimeter of the sensor die, a bottom of the isolation cavity exposing a portion of the first low modulus isolation material.

3. The semiconductor device package of claim 2, further comprising a second isolation material disposed in the isolation cavity.

4. The semiconductor device package of claim 1, further comprising a semiconductor die attached to the package substrate, the encapsulant further encapsulating the semiconductor die.

5. The semiconductor device package of claim 4, wherein a conductive feed in the package substrate is configured to provide a conductive path between the semiconductor die and the sensor die.

6. The semiconductor device package of claim 1, wherein the sensor die is characterized as a pressure sensor.

7. The semiconductor device package of claim 1, wherein the encapsulant encapsulating at least a portion of the first low modulus isolation material and the package substrate is formed by way of a film assisted mold process.

8. The semiconductor device package of claim 1, further comprising a lid attached over the top surface of the encapsulant and the backside surface of the sensor die.

9. A method of manufacturing a semiconductor device, the method comprising:
   placing a sensor die on a carrier substrate, an active surface of the sensor die contacting the carrier substrate;
   dispensing a first low modulus isolation material around a perimeter of the sensor die;
   encapsulating with an encapsulant at least a portion of the first low modulus isolation material and the carrier substrate, the first low modulus isolation material at least laterally isolating the sensor die from the encapsulant;
   exposing a backside surface of the sensor die such that it is substantially coplanar with a top surface of the encapsulant, the backside surface of the sensor die opposite of the active surface of the sensor die; and
   after removing the carrier substrate, applying a package substrate on the active surface of the sensor die and bottom surfaces of the first low modulus isolation material and the encapsulant.

10. The method of claim 9, further comprising forming an isolation cavity around the perimeter of the sensor die, a bottom of the isolation cavity exposing a portion of the first low modulus isolation material.

11. The method of claim 10, wherein exposing the backside surface of the sensor die such that it is substantially coplanar with the top surface of the encapsulant comprises back-grinding the top surface of the encapsulant to expose the backside surface of the sensor die before forming the isolation cavity.

12. The method of claim 10, further comprising dispensing a second isolation material into the isolation cavity around the perimeter of the sensor die.

13. The method of claim 10, further comprising attaching a lid over the top surface of the encapsulant and the backside surface of the sensor die.

14. The method of claim 9, further comprising placing a semiconductor die on the carrier substrate before encapsulating with the encapsulant, and wherein a conductive feed in the package substrate is configured to provide a conductive path between the semiconductor die and the sensor die.

15. The method of claim 9, wherein encapsulating with an encapsulant further comprises encapsulating by way of a film assisted molding process such that a top surface of the first low modulus isolation material is exposed.

16. A semiconductor device package comprising:
a package substrate;
a sensor die with an active surface and a backside surface, the active surface attached to the package substrate;
a first low modulus isolation material formed around a perimeter of the sensor die;
an encapsulant to encapsulate at least a portion of the sensor die and the package substrate, the first low modulus isolation material to at least laterally isolate the sensor die from the encapsulant, wherein the backside surface of the sensor die is substantially coplanar with a top surface of the encapsulant; and
an isolation cavity formed around the perimeter of the sensor die, a bottom of the isolation cavity exposing a portion of the first low modulus isolation material.

17. The semiconductor device package of claim 16, further comprising a second isolation material disposed in the isolation cavity.

18. The semiconductor device package of claim 16, further comprising a semiconductor die attached to the package substrate, the encapsulant further encapsulating the semiconductor die.

19. The semiconductor device package of claim 18, wherein a conductive feed in the package substrate is configured to provide a conductive path between the semiconductor die and the sensor die.

20. The semiconductor device package of claim 16, further comprising a lid attached over the top surface of the encapsulant and the backside surface of the sensor die.

* * * * *